US007466066B2

(12) United States Patent
Porzio et al.

(10) Patent No.: US 7,466,066 B2
(45) Date of Patent: Dec. 16, 2008

(54) LONGITUDINALLY DRIVEN SLOTTED CYLINDER TRANSDUCER

(75) Inventors: Raymond Porzio, Lafayette, NY (US); David J. Erickson, Liverpool, NY (US); Todd C. Gloo, Liverpool, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 450 days.

(21) Appl. No.: 11/268,089

(22) Filed: Nov. 7, 2005

(65) Prior Publication Data

US 2006/0113872 A1 Jun. 1, 2006

Related U.S. Application Data

(60) Provisional application No. 60/625,352, filed on Nov. 5, 2004.

(51) Int. Cl.
*H01L 41/04* (2006.01)
*H01L 41/083* (2006.01)

(52) U.S. Cl. .................. 310/334; 310/328; 310/323.21

(58) Field of Classification Search ............ 310/323.21, 310/328, 334
See application file for complete search history.

(56) References Cited

U.S. PATENT DOCUMENTS

| | | | | |
|---|---|---|---|---|
| 3,277,433 | A * | 10/1966 | Toulis | 367/155 |
| 4,384,351 | A * | 5/1983 | Pagliarini et al. | 367/175 |
| 2007/0206441 | A1* | 9/2007 | Porzio | 367/163 |

FOREIGN PATENT DOCUMENTS

| | | |
|---|---|---|
| DE | 4244704 | 3/1994 |
| GB | 2052740 | 1/1981 |
| JP | 10080164 | 3/1998 |

OTHER PUBLICATIONS

International Search Report dated Dec. 14, 2006 for related PCT Application No. PCT/US05/40118.

* cited by examiner

*Primary Examiner*—J. A San Martin
(74) *Attorney, Agent, or Firm*—Howard IP Law Group, PC

(57) ABSTRACT

A longitudinally driven slotted transducer has a tubular member with an axial slot extending from one end to the other end. A drive assembly is disposed across the inner wall of the tubular member and supported by journal bearing surfaces extending from opposing sides of the inner wall to locate the drive assembly in a position offset from the longitudinal central axis of the tubular member. The interface between the drive assembly and tubular member comprises a layer of solid lubricant material mounted on the journal bearing type surfaces.

33 Claims, 6 Drawing Sheets

LONGITUDINALLY DRIVEN SLOTTED CYLINDER TRANSDUCER

RELATED APPLICATIONS

This application claims priority to U.S. Provisional Patent Application No. 60/625,352, filed Nov. 5, 2004, the subject matter thereof incorporated by reference herein in its entirety.

FIELD OF THE INVENTION

The invention in general relates to transducer devices, and more particularly, to a longitudinally driven electro acoustical transducer.

BACKGROUND OF THE INVENTION

Electroacoustical transducers are advantageous because they provide a conversion between electrical energy and acoustical energy. For example, when alternating current signals are introduced to an electroacoustical transducer, the transducer vibrates and produces acoustical energy in accordance with such vibrations. The conversion of electrical energy to acoustical energy has a number of different uses such as in loud speakers and in sonar applications, for example. Electroacoustical transducers have been known for a considerable number of years. One such transducer is described in U.S. Pat. No. 4,651,044 issued on Mar. 1, 1987 to Kompaneck.

U.S. Pat. No. 4,651,044 discloses an electroacoustical transducer generally illustrated at 10 and shown in prior art FIG. 1 including a tubular member 12 with a gap 14. The gap 14 has a relatively short circumferential length and extends axially along the full length of the member 12. The member 12 may be made from a metal such as a steel having elastic properties. The thickness and diameter of the metal tube are selected to produce vibrations, in the nature of the vibrations of a tuning fork, at a preselected frequency such as between approximately two (2) kilohertz and four hundred (400) hertz.

A plurality of sectionalized transducer elements 16 are arrayed within the member 12 in abutting and progressive relationship to one another and in abutting relationship to the inner wall of the member 12. The sectionalized elements 16 are provided with equal circumferential lengths and thicknesses and are disposed in symmetrical relationship to the member 12, and in symmetrical relationship to the gap 14 in the member. The sectionalized elements 16 are formed from a suitable ceramic material having piezoelectric characteristics. The elements 16 are bonded to the inner wall of the member 12 by a suitable adhesive 18. The adhesive 18 has properties for insulating the sectionalized elements from the tubular member 12. The ceramic material for the elements 16 and the adhesive 18 are well known in the art.

The sectionalized elements 16 are polarized circumferentially rather than through the wall thickness. Such a polarization is designated in the art as a "$D_{33}$ mode". Alternating current signals are introduced to the sectionalized elements 16 from a source 20. The introduction of such signals to the elements in the plurality may be provided on a series or parallel basis.

When alternating current signals are introduced from the source 20 to the elements 16, the signals produce vibrations of the sectionalized elements 16. These vibrations in turn produce vibrations in the tube 12, which functions in the manner of a tuning fork. The frequency of these vibrations is dependent somewhat upon the characteristics of the sectionalized elements such as the thickness and diameter of the tubular member or ring 12. As a result, for a ring 12 of a particular diameter, the resonant frequency of the transducer 10 may be primarily controlled by adjusting the thickness of the ring 12.

FIG. 2 illustrates another prior art transducer including a metal tube 12 corresponding to that shown in FIG. 1 and further including sectionalized elements 16. The sectionalized elements are linearly stacked in abutting relationship to one another and are attached to the inner wall of the tube 12 at diametrical positions equally spaced from the ends of the gap 14. The elements at the end of the stack are suitably bonded to the inner wall of the tubular member 12. Thus, when alternating current signals are introduced to the sectionalized elements, the elements vibrate and produce vibrations in the tube 12. The vibrations of the tube 12 at positions adjacent to the gap 14 in FIG. 2 are similar to the vibrations of the tube 12 adjacent to the gap 14 in FIG. 1.

In the prior art depicted in FIG. 3, a pair of driving rods 30 and 32 are connected to the ends of the tubular member 12 at a position adjacent the gap 14. Thus, the rods 30 and 32 move reciprocally in accordance with the vibrations of the tube 12. The rods 30 and 32 reciprocate in a push-pull relationship such that one of the rods is moving to the right at the same time that the other rod is moving to the left as the tube 12 expands and contracts. With high power, the rods 30 and 32 can work in such equipment as a pile driver or a trench digger. The frequency of the reciprocatory movement of the rods 30 and 32 can be approximately four hundred (400) hertz when the tubular member 12 has a diameter of at least one foot (1'0") and a wall thickness of approximately five eighths of an inch (⅝") and has capabilities of being driven at a very high power such as a power of at least eight (8) kilowatts.

FIG. 4 shows the use of the transducer of FIG. 1 as a "remote" sonic system. Here the prior art transducer is coupled to a replaceable knife 40 through a flexible shaft 42. The use of the flexible shaft 42 provides the housing of the transducer and the source with a position displaced from an operator holding the knife 40. The flexible shaft 42 has a transverse modulus capable of propagating to the knife 40 the sound waves generated by the transducer. A system such as shown in FIG. 4 has a number of different applications including cutting, drilling and massaging.

FIG. 5 schematically illustrates the use of a plurality of the transducers of FIGS. 1 and 2 in an array having utility as a sonar transducer. The array is shown as being formed from six transducers. These transducers are respectively designated as 10*a*, 10*b*, 10*c*, 10*d*, 10*e* and 10*f*. The transducers in the array can be connected electrically in series or in parallel depending upon the pattern of the acoustical beam to be produced. The array can be encapsulated in a steel or rubber boot 50 which can be filled with oil 52. The transducers 10*a* through 10*f* are disposed with their gaps 14 in a particular phase relationship to one another in the annular direction. The gaps 14 for each of the successive transducers are shown as being rotated 90 degrees from the adjacent transducer. The acoustical power from the array can be directed in a beam having any directional properties desired by providing a proper phase relationship for the gaps in the different transducers. Such a phase relationship can be obtained by rotating the transducers so that their gaps face in particular directions relative to one another.

A plurality of transducers can also be mounted on a vertical rod 60 such as shown in FIG. 6. The length of this rod depends upon the area to be actuated acoustically. For example, eight transducers are shown in FIG. 6 as being mounted on the rod 60 in equally spaced relationship. Each of the transducers is shown as being rotated approximately 90 degrees from the transducer directly above it. This provides for an acoustical output having omnidirectional characteristics in the "near field" condition.

The above-mentioned prior art (e.g. FIGS. 1, 3 and 4) thus describe typical slotted cylinders driven with a cylindrical ceramic stack located on the inner diameter of the inert shell (FIG. 1). The prior art structure of FIG. 2 illustrates incorporation of a longitudinal driver to replace the more expensive and labor intensive ceramic cylinder stack. However, such an implementation of a longitudinal drive is likely to result in a broken stack due to bending moments imparted by the shell on the stack during operation. Further, such a structure results in poor electromechanical coupling due to stack bending and mismatching the very stiff stack to the low stiffness shell. Still further, the placement of the stack across the shell geometric center and halfway up the shell results in less than optimal motion amplification and the stack/shell interface would be subject to fretting corrosion. The wall driven stack (FIG. 1) is both expensive and prone to increased failure rates. Accordingly, alternative transducer driver designs are desired.

SUMMARY OF THE INVENTION

In accordance with an aspect of the present invention, there is described a journal bearing approach to mounting the stack in the shell which solves the stack bending and breakage problem. This enables one to mount the stack lower in the shell for a better lever-arm and greater motion amplification. By modifying the shape of the cylinder wall to better match the stiffness of the stack, a higher electromechanical coupling is achieved.

An electro-acoustical transducer having a journal bearing coated with a solid lubricant avoids imparting bending stresses on the longitudinal electro-ceramic or magnetostrictive driver and fretting corrosion on the stack/shell interface. The technique according to an aspect of the invention also positions the stack lower in the shell away from the gap and closer to the nodal region to provide a greater lever arm effect and better impedance matching, relative to the conventional approach of mounting the stack across the cylinder's center.

According to another aspect of the invention, there is provided an inert slotted cylinder shell structure having a ceramic or magnetostrictive drive assembly which applies stress to the inner diameter of an inert slotted cylinder shell. The interface between the stack and shell comprises a layer of solid lubricant material mounted on a journal bearing type surface.

According to another aspect of the present invention, a longitudinally driven slotted cylindrical transducer structure comprises a tubular member having an outer wall, an inner wall opposing the outer wall, and an axial slot formed there through; and a mounting arrangement formed along portions of the inner wall and including opposing journal bearing surfaces for receiving one or more sectionalized vibratory elements at a position offset from the longitudinal central axis of the tubular member.

According to yet another aspect, a transducer comprises a longitudinal tubular member symmetrically disposed about a central longitudinal axis, the tubular member having a slot extending from the front end of the member to the rear end of the member, the slot extending parallel to the central longitudinal axis; and a stack comprising a single element or plurality of vibratory elements arranged from a first to a second end; and a mounting arrangement for mounting the stack across the inner wall of the tubular member on a line relatively transverse to the longitudinal central axis, the mounting arrangement including a layer of solid lubricant engaging opposite ends of the stack, enabling the stack to move in a direction of the central axis when the stack exhibits vibratory motion.

The present invention provides a lower cost alternative to existing wall driven slotted cylinders by enabling them to be effectively driven in a longitudinal mode. The invention remedies the low coupling and poor performance of prior designs due to stack bending and fretting corrosion at the stack/shell interface due to micromotion in the direction orthogonal to the horizontal drive direction.

BRIEF DESCRIPTION OF THE DRAWINGS

Understanding of the present invention will be facilitated by consideration of the following detailed description of the preferred embodiments of the present invention taken in conjunction with the accompanying drawings, in which like numerals refer to like parts, and.

DETAILED DESCRIPTION OF THE INVENTION

It is to be understood that the figures and descriptions of the present invention have been simplified to illustrate elements that are relevant for a clear understanding, while eliminating, for the purpose of clarity, many other elements found in typical slotted cylinder transducers and drive assemblies and methods of making and using the same. Those of ordinary skill in the art may recognize that other elements and/or steps may be desirable in implementing the present invention. However, because such elements and steps are well known in the art, and because they do not facilitate a better understanding of the present invention, a discussion of such elements and steps is not provided herein.

Figure 1:
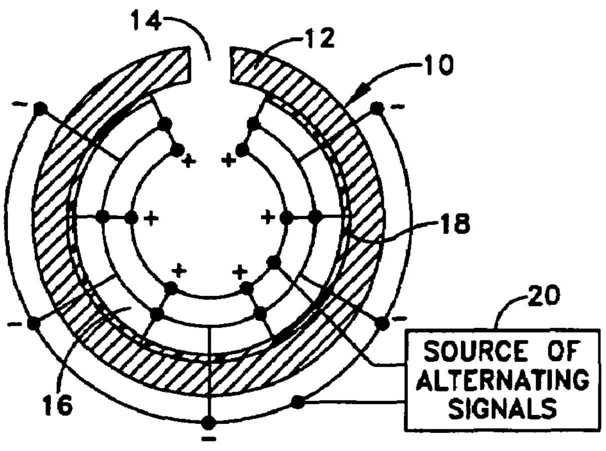
FIG. 1 (PRIOR ART)
FIG. 1 illustrates a sectional view of a prior art transducer.
Figure 2:
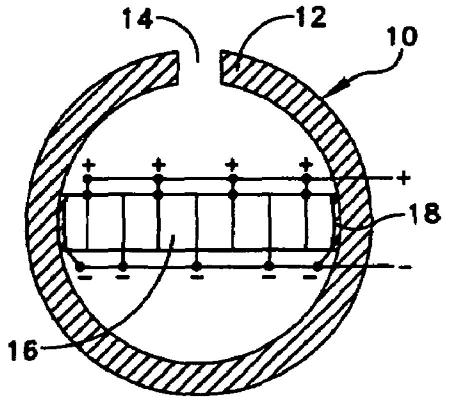
FIG. 2 (PRIOR ART)
FIG. 2 is a sectional view, similar to FIG. 1, of another prior art transducer.
Figure 3:
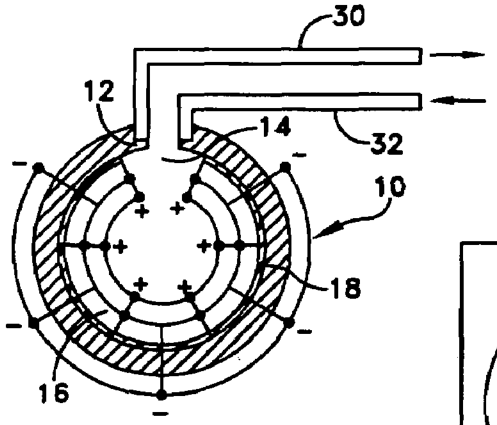
FIG. 3 (PRIOR ART)
FIG. 3 is a sectional view of a tool incorporating the transducer of FIG. 1.
Figure 4:
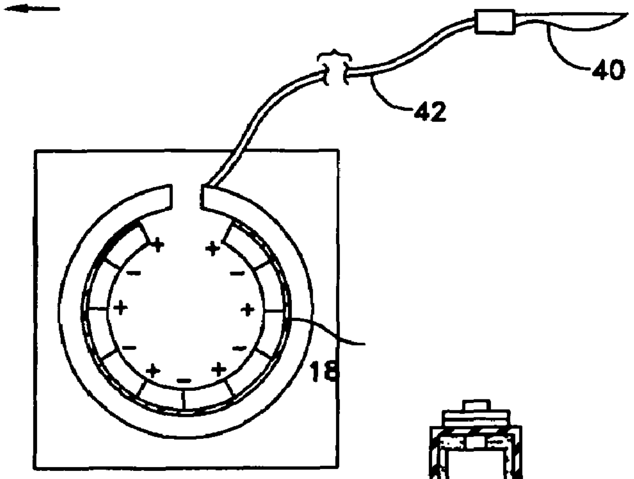
FIG. 4 (PRIOR ART)
FIG. 4 is a schematic sectional view of another tool incorporating the transducer of FIG. 1.
Figure 5:
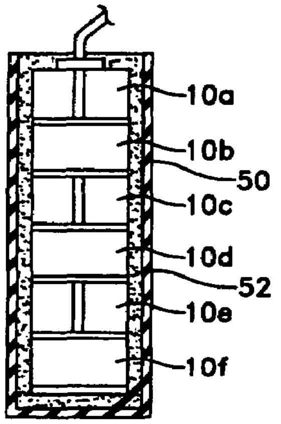
FIG. 5 (PRIOR ART)
FIG. 5 is a schematic illustration of an array of transducers, each constructed as shown in FIG. 1 or 2.
Figure 6:
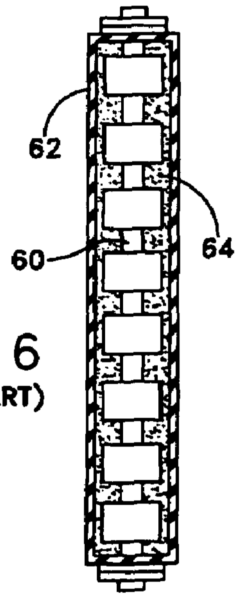
FIG. 6 (PRIOR ART)
FIG. 6 illustrates another array of transducers constructed as shown in FIG. 1 or 2.
Figure 7A:
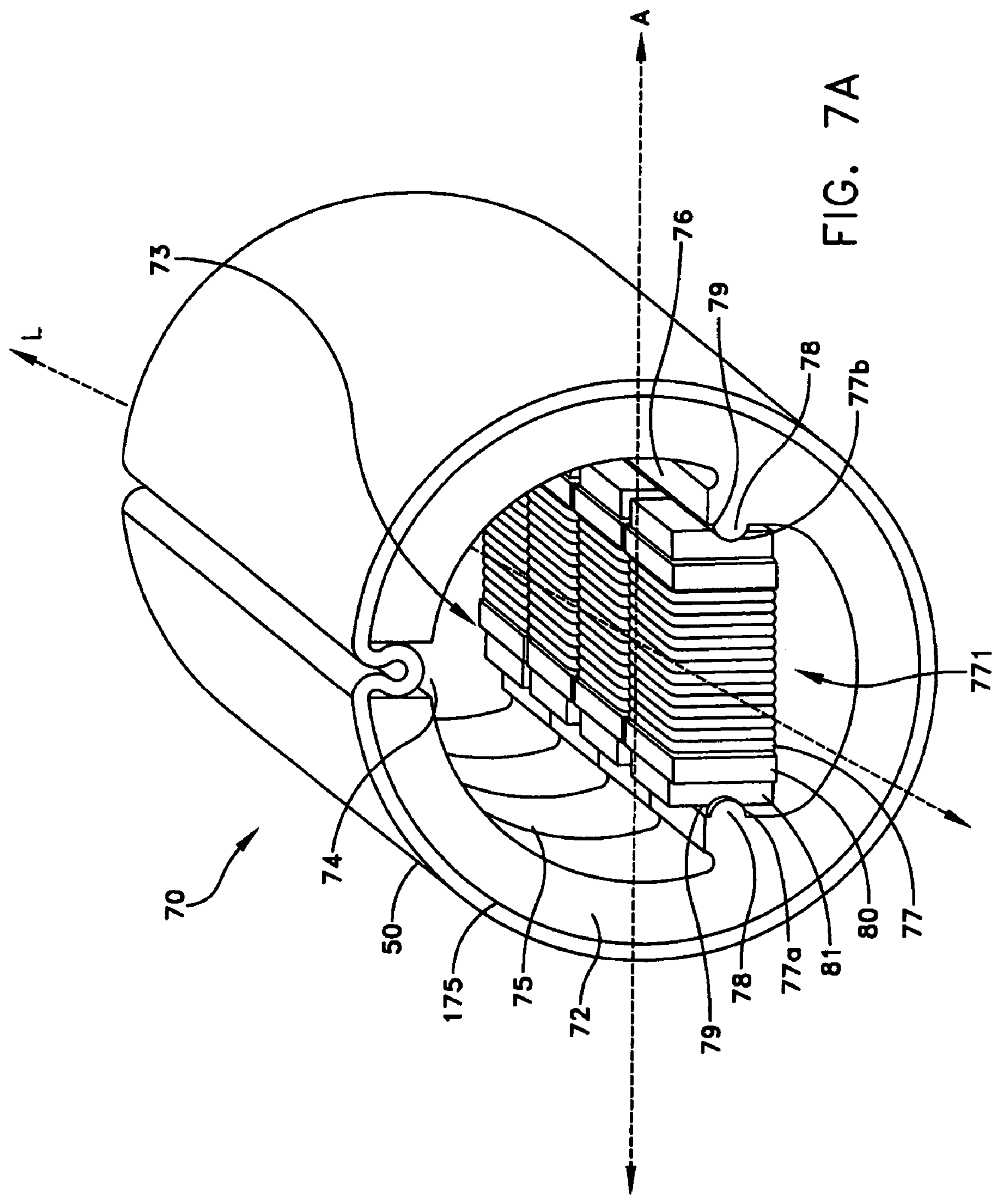
FIG. 7A illustrates a magnetostrictive transducer according to an embodiment of the present invention.
Figure 7B:
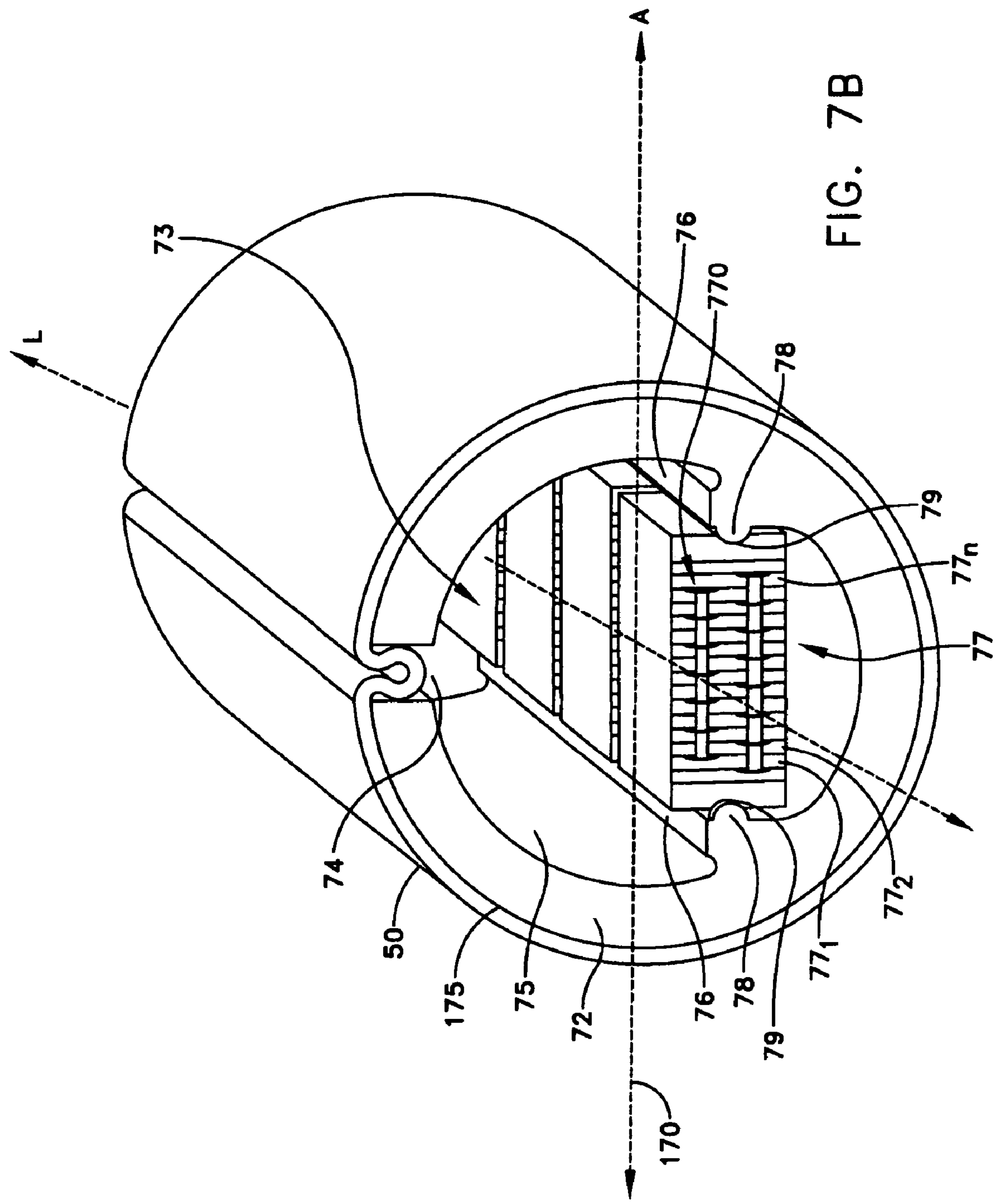
FIG. 7B illustrates a ceramic transducer according to an embodiment of the present invention.
Figure 7C:
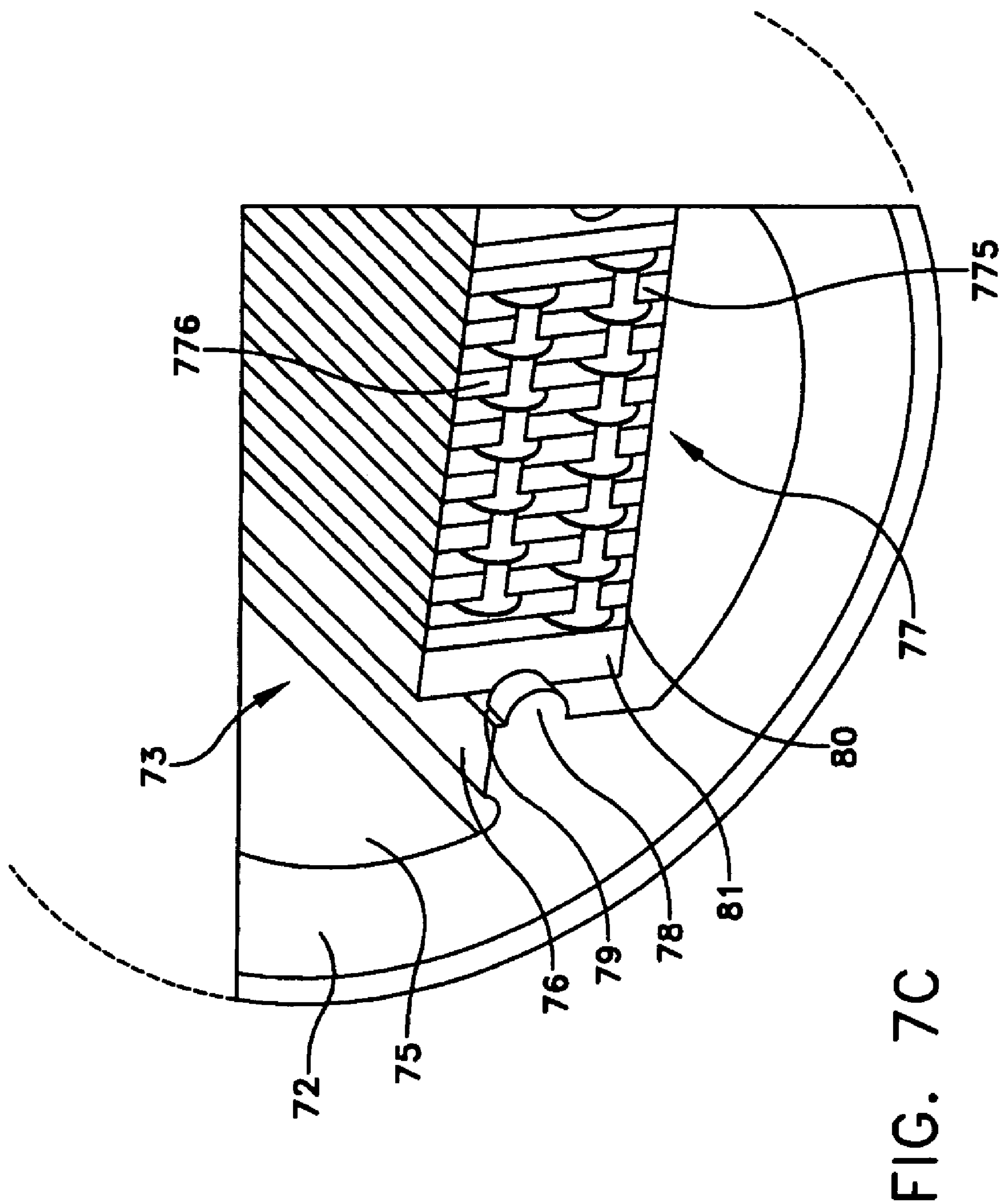
FIG. 7C is a more detailed illustration of the components of the transducer illustrated in FIG. 7B.
Figure 8:
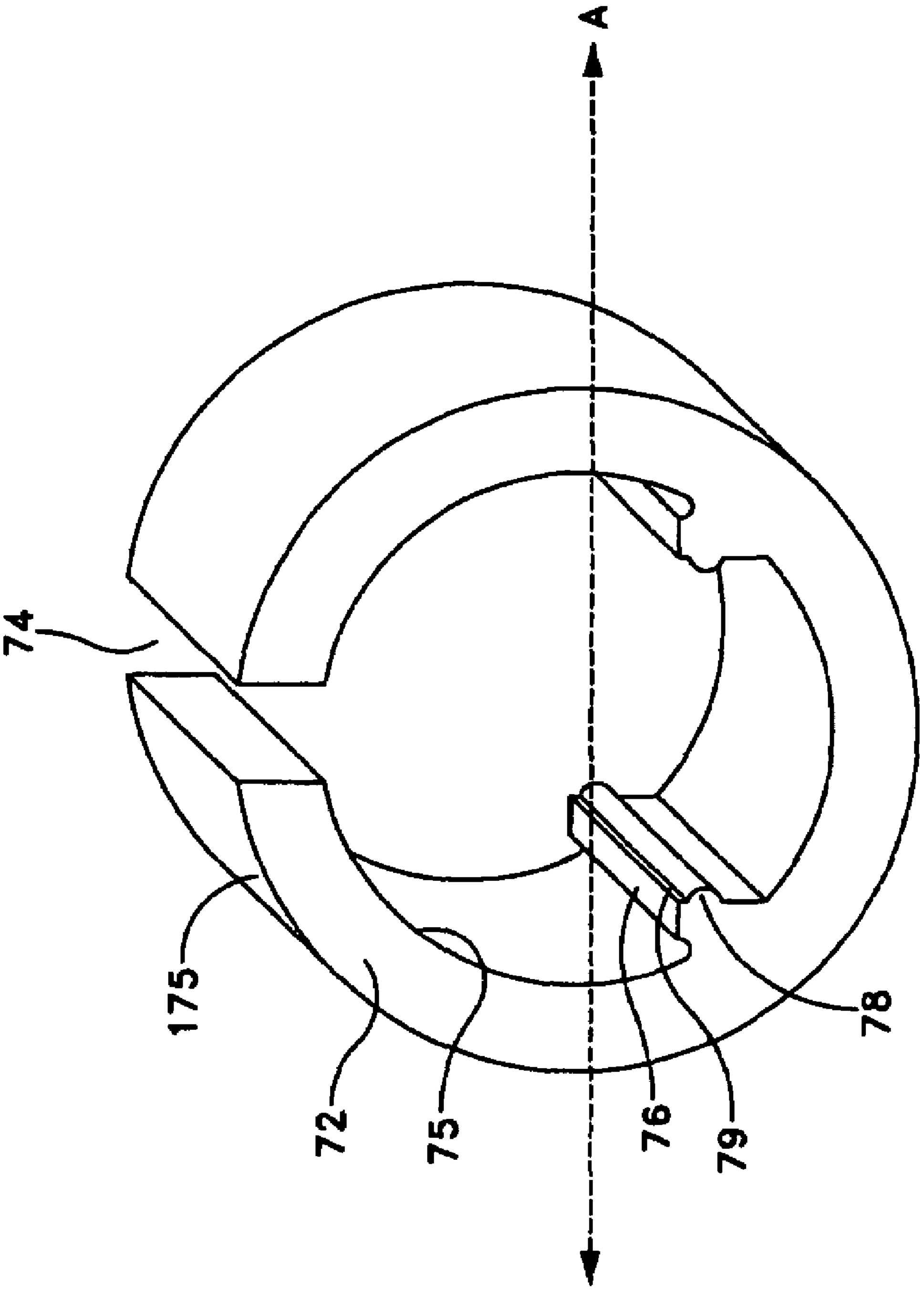
FIG. 8 illustrates a cylindrical transducer shell configuration for accommodating the drive assemblies illustrated in FIGS. 7A-7C according to an embodiment of the present invention.

Referring now to FIGS. 7A, 7B and 7C there is shown a transducer 70 comprising an inert slotted cylinder or tubular shell structure 72 having a drive assembly 73 which applies stress to the inner diameter (ID) or inner wall 75 of the inert slotted cylinder shell 72. In one configuration (e.g. FIG. 7A) a magnetostrictive drive assembly comprises a vibratory member such as magnetostrictive stack 77 disposed within a coil 771 surrounding the stack. The stack may be a single rod of magnetostrictive material or a plurality of coaxial rod sections, for example. In another configuration (e.g. FIG. 7B)

a ceramic drive assembly comprises a vibratory member such as one or more stacks of sectionalized vibratory elements 77, such as piezoelectric elements. FIG. 8 illustrates the shell structure 72 capable of receiving the corresponding drive assembly illustrated in FIGS. 7A-7C. In any event, the drive assembly comprises a vibratory member such as one or more stacks of sectionalized vibratory elements that may be formed from a suitable magnetostrictive material, or a piezoelectric material such as a ceramic having piezoelectric characteristics. Each stack extends across the inner wall of shell 72 with the stacks linearly arranged along the longitudinal axis of the transducer. In the embodiment illustrated in FIGS. 7B-7C, the sectionalized elements $\mathbf{77}_1$, $\mathbf{77}_2$, . . . , $\mathbf{77}_n$ are of the same length and thickness and are linearly stacked in abutting relationship to one another. Electrical connectivity 770 to/from the stack for vibrating the elements is provided, as is known in the art. In the exemplary embodiment shown in FIGS. 7B-7C, the electrical connectivity is schematically depicted as positive 775 and negative 776 (FIG. 7C) conductor electrodes alternatively electrically coupled to corresponding element segments within each stack in order to apply the appropriate polarity to each element segment so as to cause the elements to vibrate when a biasing source such as an alternating current signal is introduced, as is known in the art. The stack of sectionalized elements 77 abuts at opposite ends 77*a*, 77*b* corresponding portions of inner wall 75. More particularly, inner wall 75 of slotted, tubular or cylindrical shell 72 includes oppositely disposed, inwardly extending wall segments having ledge or channel portions 76 terminating in a journal bearing type surface 78. The interface between the stack and shell comprises a layer 79 of solid lubricant material mounted on the journal bearing type surface 78. Solid lubricant layer 79 operates to minimize the erosion of the stack and the shell interface as well as allow rotational motion at the stack/shell interface. One or more backing or acoustic matching layers may be disposed at respective ends 77*a*, 77*b* of the drive assembly for providing the structural support and acoustic matching of the stack with the shell. In an exemplary embodiment, the use of low modulus drive materials, such as soft ceramic, high coupling PMN and Terfenol, may be utilized in conjunction with lubricant layer 79 at the journal bearing interface retaining the stack within the shell structure. The cylindrical shell structure 72 may be made from a metal such as steel having elastic properties, as is understood by one skilled in the art.

In an exemplary embodiment of the invention, the inwardly extending ledge portion and journal bearing type surface 78 is positioned about inner wall 75 such that the stack 77 is offset from the shell central longitudinal axis L a predetermined amount. In one configuration, the offset may be from about 5% to 80% from the central longitudinal axis L, with the horizontal center axis A orthogonal to the central longitudinal axis L and bisecting the circumferentially shaped cylindrical shell 72. The stack placement enables improved shell displacement (closer to the nodal region of the shell's fundamental bending mode). The resulting configuration permits a more favorable shell-to-stack stiffness ratio and higher electromechanical coupling.

When alternating current signals are introduced to the sectionalized elements, typically via electrical connections or leads coupled to the corresponding stacks of elements as is known in the art, the elements vibrate and produce vibrations in the shell at positions adjacent to the gap 74. The thickness and diameter of the shell is selected to produce the vibrations at a preselected frequency and/or over a wide range of frequencies in the infrasonic, audible and ultrasonic bands as such frequency ranges are understood by those skilled in the art. The solid lubricant and journal bearing approach is directly applicable to conventional flextensional projectors to avoid stack bending problems. A protective cover or boot 50, typically made of rubber, surrounds the outer wall 175 of the transducer shell 72, as is well known in the art.

FIG. 7A illustrates an exemplary magnetostrictive implementation of the transducer drive assembly wherein the assembly may comprise materials such as Terfenol-D, single crystal magnetostrictive alloys, and the like. FIG. 7B illustrates a ceramic implementation of the transducer drive assembly formed of PZT, PMN (lead magnesium niobate) or single crystal ceramic materials, for example. FIG. 7C provides a more detailed illustration of that depicted in FIG. 7B of an embodiment of the drive assembly 73 within the transducer shell 72 wherein a uniform layer 79 of solid lubricant is disposed about the cylindrical journal bearing 78 defining the interface between the wall portion 75 and the ceramic stack 77 of sectionalized elements mounted to optimize displacement and coupling with backing/acoustic matching layers 80, 81. In an exemplary embodiment, layer 80 represents an insulative layer that terminates the stack of sectionalized elements 77. Layer 80 is preferably formed of a ceramic material having substantially the same thickness as each of the sectionalized elements of the stack. Layer 81 is preferably a metal such as steel or alumina, for example, that engages the inner wall at the journal bearing interface 78 for strengthening or reinforcing the flextensional transducer. The bearing surface 78 is coated with the solid lubricant 79 so that essentially no bending stresses are transferred to the stack (enabling additional degrees of freedom provided by the bearing). The stack is loaded by opening the shell, inserting the stack, and then releasing the shell, to thereby provide an interference fit between the stack/shell interface.

The transducer is formed by providing a relatively soft and resilient (relative to the stack) shell structure 72. The structure 72 is forcibly opened and the relatively rigid stack is inserted therein. In this manner the stack is compression fit into the shell (as opposed to adhesively coupling or cementing the stack/shell interface).

Figure 9C:
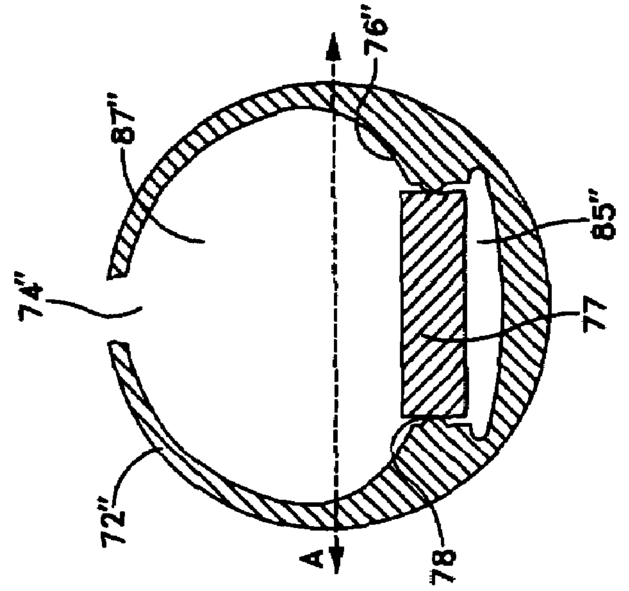
FIGS. 9A, 9B and 9C illustrate exemplary embodiments of cylindrical transducer shell configurations in accordance with the principles of the present invention.
Figure 9B:
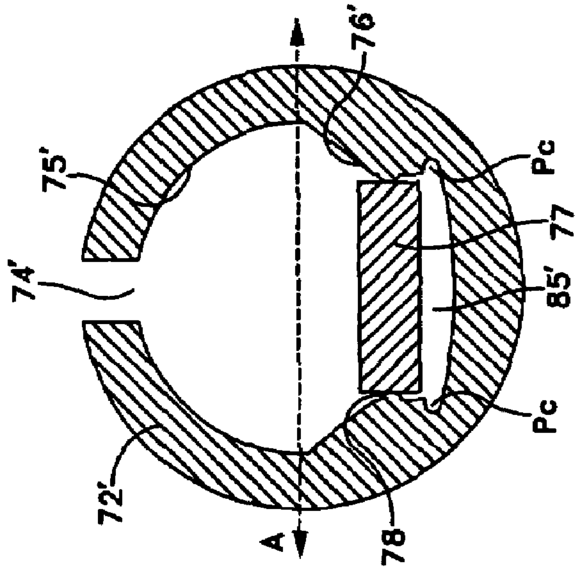
Figure 9A:
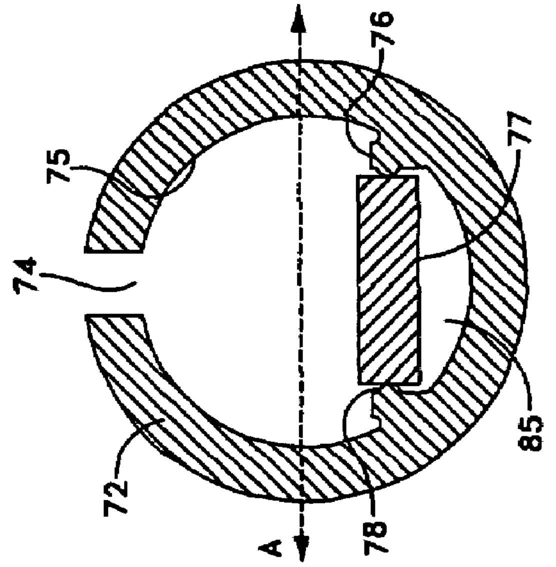

FIGS. 9A, 9B, and 9C illustrate alternative shell structures for use in accordance with the principles of the present invention. As shown in FIG. 9A, the cylindrical shell structure 72 is of uniform circumferential thickness t with inwardly extending wall segments and ledge portions 76 positioned such that the stack 77 is offset from the longitudinal central axis L of the device. FIG. 9B shows a cylindrical shell structure with inwardly extending wall segments and ledge portions 76' in a linearly sloped configuration beginning at a position Pa substantially along the longitudinal axis of the shell and terminating at position Pb. The inner wall 75' of the shell structure illustrated in FIG. 9B includes recessed portions Pc symmetrically positioned about the lower portion 85 of shell 72'. As shown in FIG. 9B, the lower portion of the shell is of non-uniform circumferential thickness. FIG. 9C illustrates a further alternate configuration wherein the entire shell structure is of non-uniform circumferential thickness. More particularly, both the upper portion 87" and lower portion 85" of the shell 72" are non-uniform in thickness. As illustrated in FIG. 9C, the inner wall forms an oval or elliptical configuration rather than the substantially circular geometry of FIG. 9A. Further, the inner ledge portion 76" forms a non-linearly sloped or curved segment terminating in journal bearing surface 78. These transducers exhibit various displacements and sensitivities across each of the configurations and are adaptable according to the desired application.

It is understood that driving slotted cylinders with a longitudinal (bar) type drivers as opposed to much more expensive and often failure prone wall driven approaches is desirable. The wall driven slotted cylinders have the advantage of a good impedance match between the inert shell and the active wall located on the inner diameter (ID) of the inert shell. This results in effective transducer coupling in the range of about 0.28 to 0.38. An improvement offered by the present invention results in electromechanical coupling which approaches these values when using softer ceramic drive materials presently available and should equal or surpass these values with high coupling PMN (lead magnesium niobate) and single crystal ceramic and magnetostrictive materials.

The present invention provides a lower cost alternative to existing wall driven slotted cylinders by enabling them to be effectively driven in a longitudinal mode. The invention also provides remedies to the low coupling and poor performance of prior designs due to stack bending and fretting corrosion at the stack/shell interface due to micromotion in the direction orthogonal to the horizontal drive direction. The use of a lubricant such as the solid lubricant Kapton or other polyimides or equivalent or similar solid lubricant material applied to the journal bearing type interface in conjunction with the offset ceramic or magnetostrictive stack enables a more efficient and improved transducer design. The present invention avoids stack bending problems to enable a stack mounting approach to be used in flextensional projectors in arrays which experience non symmetric radiation pressures, to avoid the "banana" mode exhibited in existing devices. The present invention finds applicability in both surface and subsurface platforms, sonobuoys, decoys, UUV's, geophysical exploration, acoustic sweep anti mine operations, target simulators and the like.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. For example, the use of the solid lubricant and journal bearing approach may be implemented within a transducer structure having a vibratory member either centered or offset from the longitudinal central axis. It is therefore contemplated that the appended claims will cover any such modifications or embodiments as fall within the true scope of the invention.

The invention claimed is:

1. A longitudinally driven slotted cylindrical transducer structure comprising:

a tubular member having an outer wall, an inner wall opposing said outer wall, and an axial slot formed there through;

a mounting arrangement formed along portions of said inner wall and including opposing journal bearing surfaces for receiving one or more sectionalized vibratory elements at a position offset from the longitudinal central axis of said tubular member.

2. The transducer structure of claim 1, wherein said opposing journal bearing surfaces are coated with a layer of solid lubricant.

3. The transducer structure of claim 2, wherein said opposing journal bearing surfaces for receiving a stack of sectionalized vibratory elements at a position offset from the longitudinal central axis of said tubular member are adapted to receive opposite ends of said stack in compression fit.

4. The transducer structure of claim 3, wherein said sectionalized elements comprise one of magnetostrictive and piezoelectric elements.

5. The transducer structure of claim 1, wherein said opposing journal bearing surfaces extend in a longitudinal direction on the inner wall of said tubular member.

6. The transducer structure of claim 1, wherein said axial slot is formed along a direction substantially transverse to a horizontal center axis of said tubular member.

7. The transducer structure of claim 6, wherein said layer of solid lubricant comprises a polyimide.

8. The transducer structure of claim 1, wherein said tubular member is of uniform circumferential thickness.

9. The transducer structure of claim 1, wherein said tubular member has a greater circumferential thickness at symmetrical areas of opposing sides of said inner walls from which said journal bearing surfaces extend.

10. The transducer structure of claim 1, wherein said tubular member is of a non-uniform circumferential thickness having tapered symmetrical inner walls extending symmetrically from both sides of said slot to form an oval like cross sectional configuration.

11. The transducer structure of claim 10, wherein said oval like cross section is elliptical.

12. The transducer structure of claim 1, when said offset is between 5 to 80 percent from the longitudinal central axis of said tubular member.

13. The transducer structure of claim 1, wherein said tubular member has a thickness and diameter adapted to produce vibrations between 200 Hz and 20 KHz.

14. A longitudinally driven slotted cylindrical transducer having a tubular member with an axial slot extending from a first to a second end of said tubular member and having sectionalized vibratory elements extending across the inner wall of said tubular member, wherein said elements operate to vibrate to thereby cause said tubular member to vibrate, said transducer comprising:

means coupled to opposing sides of said inner wall of said tubular member to locate said sectionalized elements in a position offset from the longitudinal central axis of said tubular member to provide an improved electromechanical coupling between said tubular member and said sectionalized elements.

15. The longitudinally driven slotted transducer according to claim 14, wherein said sectionalized elements comprise a plurality of stacked elements each of relatively the same length and thickness and linearly stacked in an abutting relationship one to the other and extending between the inner walls of said tubular member.

16. The longitudinally driven slotted transducer according to claim 15, wherein said means coupled to opposing sides of said inner wall of said tubular member include opposing journal bearing surfaces extending from each side of said inner wall and facing each other to moveably position said sectionalized elements offset from the longitudinal central axis of said tubular member to place said elements closer to the nodal region of the fundamental bendng node of said tubular member.

17. The longitudinally driven slotted transducer according to claim 16, wherein each bearing surface is coated with a layer of a solid lubricant.

18. The longitudinally driven slotted transducer according to claim 17, wherein said solid lubricant comprises a polyimide.

19. The longitudinally driven slotted transducer according to claim 16, wherein said stacked elements include a first acoustic matching layer at one end of said stack and having first means operative to couple to one bearing surface and having a second acoustic matching layer at said other end and having second means operative to couple to said other bearing surface.

20. The longitudinally driven slotted transducer according to claim 19, wherein said first and second means include a first channel at one end for coacting with said one bearing surface and a second channel at said other end coacting with said second bearing surface.

21. The longitudinally driven slotted transducer according to claim 14, when said tubular member is of uniform circumferential thickness.

22. The longitudinally driven slotted transducer according to claim 14, wherein said tubular member has a greater circumferential thickness at symmetrical areas of opposing sides of said inner walls from which said journal bearing surfaces extend.

23. The longitudinally driven slotted transducer according to claim 14, wherein said tubular member is of a non-uniform circumferential thickness having tapered symmetrical inner walls extending symmetrically from both sides of said slot to form an oval like cross sectional configuration.

24. The longitudinally driven slotted transducer according to claim 23, wherein said oval like cross section is elliptical.

25. The longitudinal ally driven slotted transducer according to claim 14, when said offset is between 5 to 80 percent from the longitudinal central axis of said tubular member.

26. The longitudinally driven slotted transducer according to claim 14, wherein said tubular member has a thickness and diameter selected to produce vibrations in the infrasonic, audible and ultrasonic bands.

27. The longitudinally driven slotted transducer according to claim 14, wherein said sectionalized elements comprise piezoelectric elements.

28. The longitudinally driven slotted transducer according to claim 27, wherein said magnetostrictive elements comprise stacked single crystal magnetostrictive alloys.

29. The longitudinally driven slotted transducer according to claim 14, wherein said sectionalized elements comprise magnetostrictive elements.

30. The longitudinally driven slotted transducer according to claim 14, wherein said sectionalized piezoelectric elements are selected from the group consisting of a hard PZT, a soft PZT, PMN (lead magnesium niolsate).

31. The longitudinally driven slotted transducer according to claim 14, wherein said sectionalized piezoelectric elements are single crystal ceramic elements.

32. The longitudinally driven slotted transducer according to claim 14, wherein said tubular member is fabricated from a metal.

33. The longitudinally driven slotted transducer according to claim 32, wherein said metal is a steel having elastic properties.

* * * * *